United States Patent [19]
Heimanson et al.

[11] Patent Number: 5,746,897
[45] Date of Patent: May 5, 1998

[54] HIGH MAGNETIC FLUX PERMANENT MAGNET ARRAY APPARATUS AND METHOD FOR HIGH PRODUCTIVITY PHYSICAL VAPOR DEPOSITION

[75] Inventors: Dorian Heimanson, Rochester, N.Y.; Mehrdad M. Moslehi, Los Altos, Calif.; Paul E. Spronz, Rochester, N.Y.; Thomas R. Omstead, Austin, Tex.

[73] Assignee: CVC Products, Inc., Rochester, N.Y.

[21] Appl. No.: 677,956

[22] Filed: Jul. 10, 1996

Related U.S. Application Data

[60] Provisional application No. 60/000,990 Jul. 10, 1995.
[51] Int. Cl.⁶ .................................................. C23C 14/35
[52] U.S. Cl. ............................................... 204/298.2
[58] Field of Search .......................... 204/298.19, 298.2

[56] References Cited

U.S. PATENT DOCUMENTS

| | | | |
|---|---|---|---|
| 3,945,911 | 3/1976 | McKelvey | 204/298 |
| 4,299,678 | 11/1981 | Meckel | 204/192.2 |
| 4,401,546 | 8/1983 | Nakamura et al. | 204/298.12 |
| 4,412,907 | 11/1983 | Ito et al. | 204/298.19 |
| 4,461,688 | 7/1984 | Morrison, Jr. | 204/192.12 |
| 4,631,106 | 12/1986 | Nakazato et al. | 156/345 |
| 4,673,482 | 6/1987 | Setoyama et al. | 204/298.16 |
| 4,865,708 | 9/1989 | Welty | 204/192.12 |
| 4,872,964 | 10/1989 | Suzuki et al. | 204/298.2 |
| 4,995,958 | 2/1991 | Anderson et al. | 204/298.2 |
| 5,079,481 | 1/1992 | Moslehi | 315/111.41 |
| 5,082,542 | 1/1992 | Moslehi et al. | 204/192.32 |
| 5,188,717 | 2/1993 | Broadbent et al. | 204/192.12 |
| 5,242,566 | 9/1993 | Parker | 204/298.2 |
| 5,248,402 | 9/1993 | Ballentine et al. | 204/298.2 |
| 5,252,194 | 10/1993 | Demaray et al. | 204/298.2 |
| 5,262,028 | 11/1993 | Manley | 204/192.12 |
| 5,282,947 | 2/1994 | Brugge et al. | 204/298.2 |
| 5,314,597 | 5/1994 | Harra | 204/192.13 |
| 5,320,728 | 6/1994 | Tepman | 204/192.12 |
| 5,330,628 | 7/1994 | Demaray et al. | 204/192.12 |
| 5,354,443 | 10/1994 | Moslehi | 204/192.12 |
| 5,415,754 | 5/1995 | Manley | 204/192.12 |
| 5,538,609 | 7/1996 | Hinterschuster et al. | 204/298.2 |

FOREIGN PATENT DOCUMENTS

| | | | |
|---|---|---|---|
| 0654543A2 | 11/1994 | European Pat. Off. | C23C 14/34 |
| 1-177368 | 7/1989 | Japan | C23C 14/34 |
| 2125440 | 3/1984 | United Kingdom | C23C 15/00 |

OTHER PUBLICATIONS

PCT International Search Report; Mailing Date Dec. 31, 1996.

PCT International Search Report; Mailing Date Dec. 12, 1996.

*Primary Examiner*—Aaron Weisstuch
*Attorney, Agent, or Firm*—Baker & Botts, L.L.P.

[57] ABSTRACT

A high magnetic flux permanent magnet array apparatus and method for high productivity physical vapor deposition includes a magnetron array with a plurality of magnet assemblies disposed proximate to a target. Each assembly comprises a first portion magnetized perpendicularly to the target, a second portion magnetized perpendicularly to the target and opposite the first portion, and a third portion positioned intermediate the first and second portions, the third portion magnetized parallel to the target.

23 Claims, 5 Drawing Sheets

HIGH MAGNETIC FLUX PERMANENT MAGNET ARRAY APPARATUS AND METHOD FOR HIGH PRODUCTIVITY PHYSICAL VAPOR DEPOSITION

RELATED APPLICATION

This application claims priority under 35 USC § 119(e)(1) to provisional application number 60/000990 filed Jul. 10, 1995.

TECHNICAL FIELD OF THE INVENTION

This invention relates in general to the field of magnetron sputtering systems, and more particularly to a high magnetic flux permanent magnet array apparatus and method for high productivity physical vapor deposition.

BACKGROUND OF THE INVENTION

The deposition of soft magnetic, high moment, magnetic materials at high rates is important to manufacturers of data storage devices. Materials must be deposited at high rates in order for cluster tools to be cost-effective and competitive in terms of throughput. Deposited films should be very smooth and uniform. An additional requirement is that materials should be deposited at relatively low temperatures (less than 150° C.) in order to avoid high tensile stress and to avoid degradation of the photoresist which is often present in the thin film head structure. High substrate temperature may also result in a transition from an amorphous to a crystalline film which may cause undesired magnetic anisotropy. A magnetron sputtering system has the advantages of higher deposition rates and lower substrate temperature when compared to diode deposition systems.

In some cases it can be difficult to use a magnetron sputtering system. The target can prevent the magnetic field from penetrating, especially when the target is a magnetic material. Some conventional systems attempt to alleviate this problem by breaking the target to allow penetration of the magnetic field. However, the gaps provide a challenge to deposition uniformity and cause difficulty in dealing with multiple target pieces. Another method of dealing with the magnetic field penetration problem is to make the target very thin. This, however, can produce a problem with poor utilization of the target. Another method is to use a diode deposition system with no magnetron. However, such systems have slow deposition rates because there is no enhancement.

A conventional ferromagnetic high speed sputter apparatus, such as suggested in U.S. Pat. No. 4,412,907, has used a target made of a ferromagnetic substance comprised of at least of two separate segments of ferromagnetic substance which are spaced apart, one from another, by a small gap. As mentioned above, this is done so that a magnetic field from a magnetic field generating means positioned behind the target is leaked out to the surface of the target. This type of conventional apparatus having a multiple pieced target is expensive to make and requires development with questionable results. In addition, the segment pattern for a round target is unknown.

U.S. Pat. No. 4,299,678 suggests a magnetron sputtering apparatus with a magnetic target material in which the saturation magnetization of the target material is substantially reduced temporarily. This is done such as by heating the target material to its Curie point, and sputtering the magnetic material while in such a state of reduced magnetization. This type of conventional apparatus is unreliable and thickness uniformity of the deposition is unpredictable.

U.S. Pat. No. 5,248,402 describes a sputtering system magnetron formed of an array of permanent magnets rotatable in proximity to a plane of a target disposed in a vacuum chamber where the magnet array has an apple shaped cross section. In this system, the magnetic path established between oppositely polled pairs of magnets is interned in a stem region proximate the axis of rotation for the array and has a pair of opposed lobes extending outward from the stem region in a generally semi-circular form. The shape of the gap produces a depth of sputter profile in the target that results in uniform coating, step coverage, and step coverage uniformity. This is especially true when such a magnetron sputtering system is used for the sputtering of non-magnetic materials to produce non-magnetic films. The same cannot be said of its use in formation of magnetic films.

In magnetron sputtering of material from a magnetic target, the target acts as a shunt to the magnetic field lines emanating from the magnetron magnet array. Thus, the field lines which penetrate a non-magnetic target and serve to deunify the plasma near the target surface are, in effect, short circuited through a magnetic target material and are thereby prevented from entering the region of the plasma.

SUMMARY OF THE INVENTION

In accordance with the present invention, a high magnetic flux permanent magnet array apparatus and method for high productivity physical vapor deposition is provided that substantially eliminates or reduces disadvantages and problems associated with previously developed magnetron sputtering systems.

According to one embodiment of the present invention, a magnetron sputtering system is provided. The magnetron sputtering system includes a high magnetic flux magnetron assembly moveably coupled to rotate about an axis. The assembly comprises an array of permanent magnet assemblies. Each permanent magnet assembly comprises a first portion magnetized perpendicularly to the target, a second portion magnetized perpendicularly to the target and opposite to the first portion, and a third portion positioned intermediate the first and the second portion, the third portion magnetized parallel to the target.

A technical advantage of the present invention is the provision of a ferromagnetic high speed sputtering apparatus that operates with a ferromagnetic target.

Another technical advantage of the present invention is the provision of an apparatus that uses an enhanced magnetic field of intensity more than the magnetic saturation value of a ferromagnetic target.

A further technical advantage of the present invention is the use of a magnetron formed of an array of permanent magnets arranged in dipole mode where the design uses a third magnet portion acting as a pole piece bridge between magnetic polar pairs.

A further technical advantage is that the present invention has an increased magnetic field source capable of penetrating magnetic materials to allow the deposition onto a high permeability magnetic target in a magnetron sputtering system without the requirements of using either a thin target or a gapped target.

BRIEF DESCRIPTION OF THE DRAWINGS

A more complete understanding of the present invention and advantages thereof may be acquired by reference to the following description taken in conjunction with the accompanying drawings in which like reference numbers indicate like features and wherein.

DETAILED DESCRIPTION OF THE INVENTION

Figure 1:
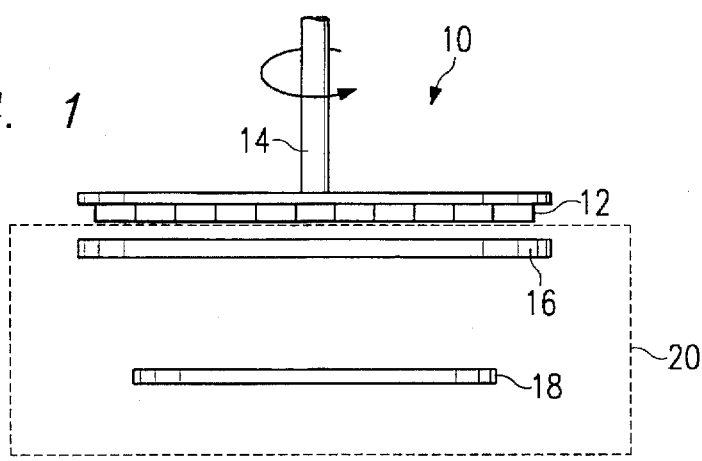
FIG. 1 is a schematic view of a magnetron sputtering system constructed according to the teachings of the present invention.

FIG. 1 is a schematic view of a magnetron sputtering system, indicated generally at 10, constructed according to the teachings of the present invention. In general, the sputtering process occurs in a vacuum chamber containing a target of material to be sputtered onto a substrate which receives a coating of film of material deposited from the target. The substrate is often a wafer in which microelectronic components are fabricated, but the substrate can also be an optical element or other structure with a surface to be coated. One magnetron sputtering system having a similar magnet array shape is disclosed and described in U.S. Pat. No. 5,248,402, the disclosure of which is incorporated herein by reference.

As shown in FIG. 1, magnetron sputtering system 10 comprises a magnet array 12 of permanent magnets rotatable about a rotational axis 14. Magnet array 12 is located proximate to and parallel with a target 16. A substrate 18 is positioned inside a vacuum chamber 20 along with target 16. One embodiment of the structure of magnet array 12 is shown and described in more detail with respect to FIGS. 2, 3, 4A, and 4B.

In operation, magnetron sputtering system 10 sputters material from target 16 onto substrate 18 to form a film of the target material on substrate 18. The rotation of magnet array 12 provides a magnetron enhancement of the sputtering process.

Figure 2:
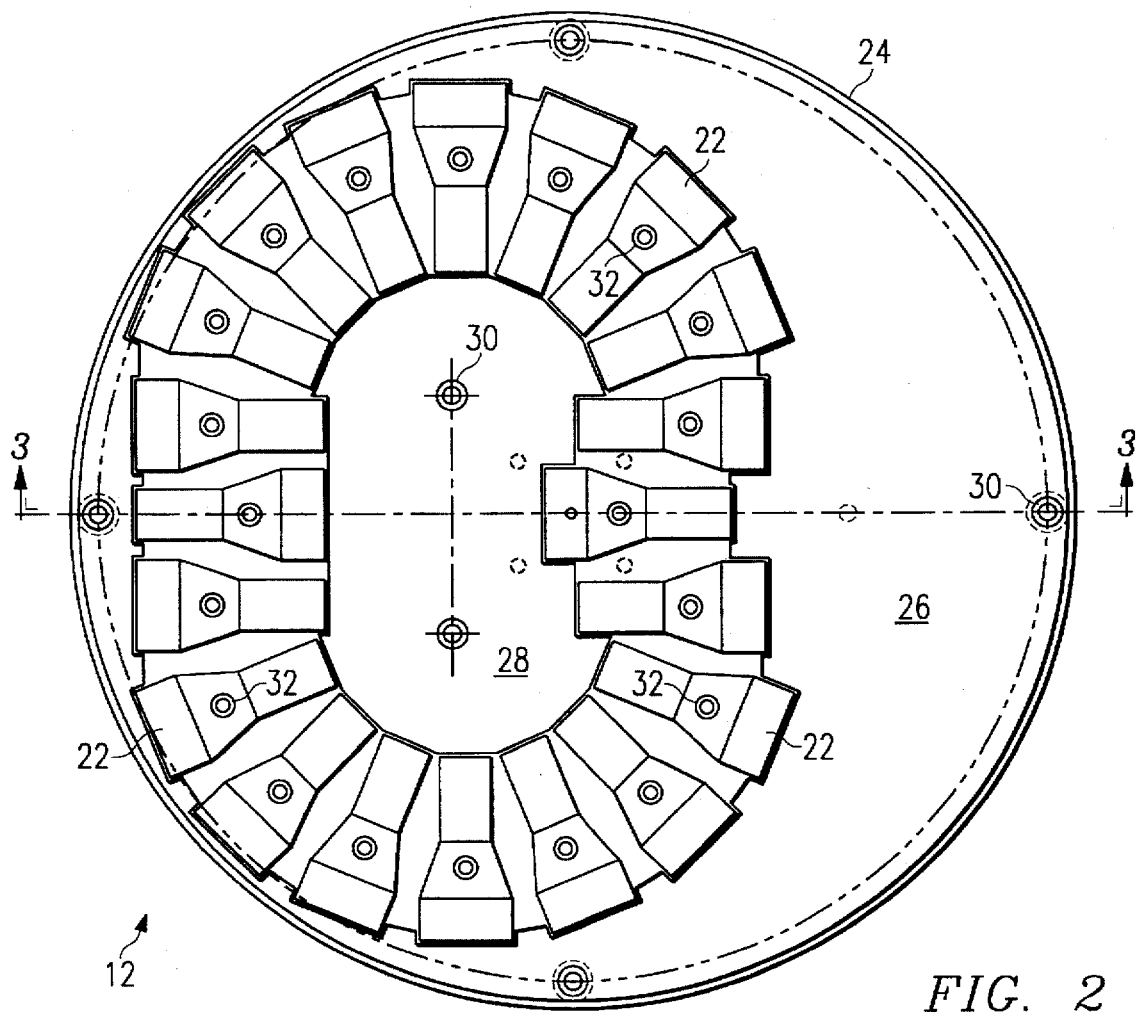
FIG. 2 is a top view of a permanent magnet array configuration constructed according to the teachings of the present invention.

FIG. 2 is a top view of a configuration of permanent magnet array 12 of FIG. 1 constructed according to the teachings of the present invention. The generally apple-shaped configuration of magnet array 12 is disclosed and described in U.S. Pat. No. 5,248,402. However, according to the teachings of the present invention, the configuration of FIG. 2 includes a magnet, which can be trapezoidally-shaped, positioned between each pair of magnets shown in U.S. Pat. No. 5,248,402. It should be further understood that the present invention includes magnet arrays 12 with configurations other than those generally apple-shaped, such as a heart-shaped magnet array.

Magnet array 12 comprises a plurality of permanent magnet assemblies 22 oriented as shown. Magnet array 12 includes a pole plate 24 on which an outer magnet retainer 26 and inner magnet retainer 28 are mounted. Pole plate 24, outer magnet retainer 26, and inner magnet retainer 28 cooperate to hold each magnet assembly 22 in place. Fastening devices 30 are used to couple inner magnet plate 28 and outer magnet plate 26 to pole plate 24 as shown. Each fastening devices 30 can comprise a screw or other suitable fastening means. Each magnet assembly 22 is coupled to pole plate 24 using a fastening device 32. Each fastening device 32 also can comprise a screw or other suitable fastening means.

Magnet array 12 is operable in magnetron sputtering system 10 to provide an apple-shaped magnetic path extending between polar pairs of permanent magnets with perpendicularly oriented magnets placed between each pair of polar magnets. By so positioning the perpendicularly magnetized magnets, the magnetic flux is forced to penetrate through target 16 even when target 16 is a magnetic material. Magnet array 12 using magnet assemblies 22 provides improved magnetron enhancement of sputtering from target 16. One embodiment of the structure of magnet assembly 22 is shown and described in more detail with respect to FIGS. 4A and 4B.

Figure 3:
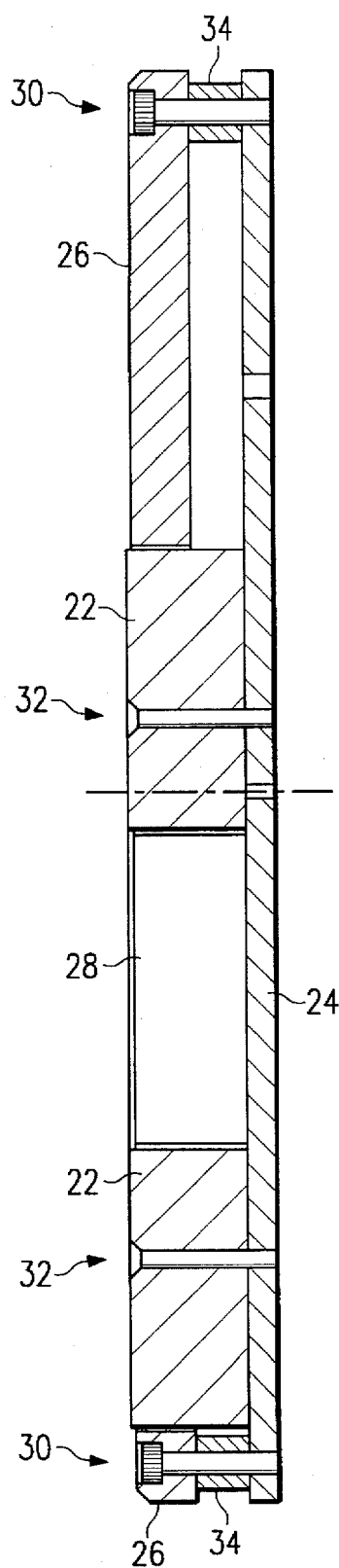
FIG. 3 is a cross-section view of the permanent magnet array of FIG. 2.
Figure 4A:
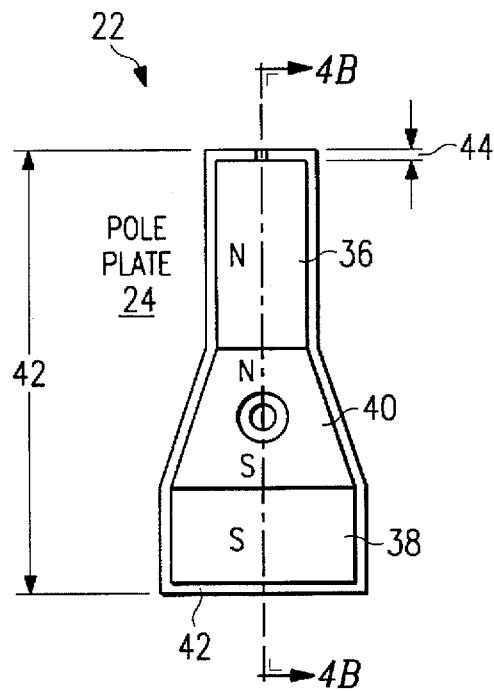
FIGS. 4A and 4B are a front view and a cross-section view of a magnet assembly of the permanent magnet array of FIG. 2.
Figure 4B:
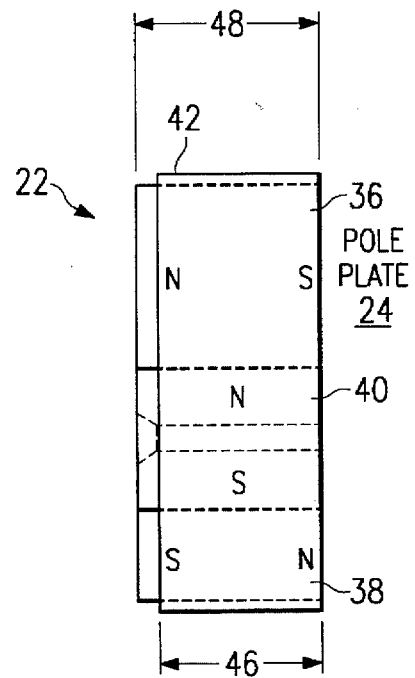

FIG. 3 is a cross-section view of magnet array 12 of FIG. 2. As shown in FIG. 3, outer magnet retainer 26 and inner magnet retainer 28 are coupled to pole plate 24. Outer magnet retainer 26 is coupled to pole plate 24 using fastening device 30. In the illustrated embodiment, fastening device 30 comprises a screw. Magnet assemblies 22 are also coupled to pole plate 24, as shown. A fastening device 32 is used to couple magnet assemblies to pole plate 24. This structure allows the precision placement of magnet assemblies 22. FIGS. 4A and 4B are front and cross-section views of a magnet assembly 22 constructed according to the teachings of the present invention. As shown in FIG. 4A, magnet assembly 22 comprises a first portion 36, a second portion 38, and a third portion 40. Magnet assembly 22 is held together as a unit by housing 42, as shown. In one embodiment of the present invention, the length 42 of magnet assembly 22 is approximately 2.4 inches, and the width 44 of housing 42 is approximately 0.063 inches. Each of first portion 36, second portion 38, and third portion 40 can comprise a separate structure, with all three structures contained within housing 42.

As shown in FIGS. 4A and 4B, first portion 36 comprises a magnet oriented such that the magnetic poles are perpendicular to pole plate 24 and thus target 16. Second portion 38 is also oriented such that the magnetic poles are perpendicular to pole plate 24 and target 16. The north pole of first portion 36 is distal pole plate 24, and the south pole of first portion 36 is proximate pole plate 24 as shown in FIG. 4B. Oppositely, the south pole of second portion 38 is distal pole plate 24, and the north pole of second portion 38 is proximate pole plate 24. This arrangement results in the second portion 38 having magnetic poles parallel to, but opposite in polarity to, first portion 36.

Third portion 40 is oriented such that the magnetic poles are parallel to pole plate 24 and target 16. This results in third portion 40 having magnetization fields substantially orthogonal to the directions of magnetization first portion 36 and second portion 38. As shown, third portion 40 is located between the first portion 36 and second portion 38. Third portion 40 is oriented such that the north pole of third portion 40 is proximate first portion 36, and the south pole of third portion is proximate second portion 38. As shown in FIGS. 4A and 4B, third portion 40 has a generally trapezoidal shape with the shorter length of the trapezoid proximate the first portion 36. It should be understood that the third portion 40 could have a rectangular or square shape. It should be further understood that the third portion 40 could be arranged such that the shorter length of the trapezoid was proximate to second portion 38. Third portion 40 operates to strengthen and enhance the magnetic field generated by first portion 36 and second portion 38 according to the teachings of the present invention.

As shown in FIG. 4B, first portion 36 and second portion 38 are oriented perpendicular to pole plate 24 and target 16. Third portion 40 is oriented parallel to pole plate 24 and target 16. In this embodiment, a width 46 of housing 42 is approximately 0.9 inches, and a width 48 of each magnet portion is approximately 1 inch.

Each of the plurality of magnet assemblies 22 is positioned in the apple core arrangement of magnet array 12. As shown in FIG. 2, the first portion 36 of each magnet assembly 22 is located along the outer edge of magnet array 12. Magnet assemblies 22 at the stem region are constructed differently than that shown in FIGS. 4A and 4B; however, the magnetic pole orientation of the magnet portions are the same. It should be understood that the teachings of the present invention benefit other magnet array configurations as well as the embodiments shown and described herein. The present invention can be incorporated into present PVD systems without modifying the plasma side of the PVD systems.

A technical advantage of the magnet assembly for use in a magnet array according to the teachings of the present invention is an increased productivity and throughput rate for the magnetron sputtering system. The present invention provides a magnet assembly with a stronger magnetic field to allow the use of thicker targets and to increase the deposition rate. The magnet assembly improves the sputtering of magnetic target materials which comprise materials having high permeability. The magnet assembly of the present invention provides a strong magnetic field to penetrate the magnetic target.

A further technical advantage of the present invention is the provision of magnetic flux at the target which allows magnetron sputtering of magnetic targets with increased deposition rate. The benefits of the present invention are applicable to any magnetron array used in a sputtering system with a magnetic target.

Figure 5A:
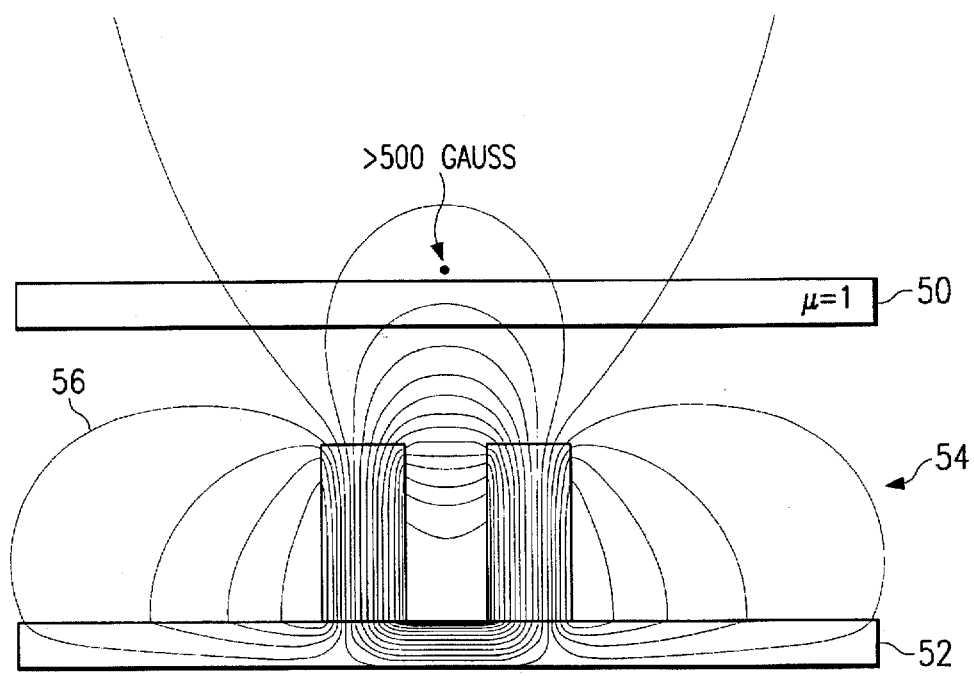
FIGS. 5A and 5B illustrate magnetic field lines for a conventional magnet assembly for a non-magnetic and a magnetic target, respectively.
Figure 5B:
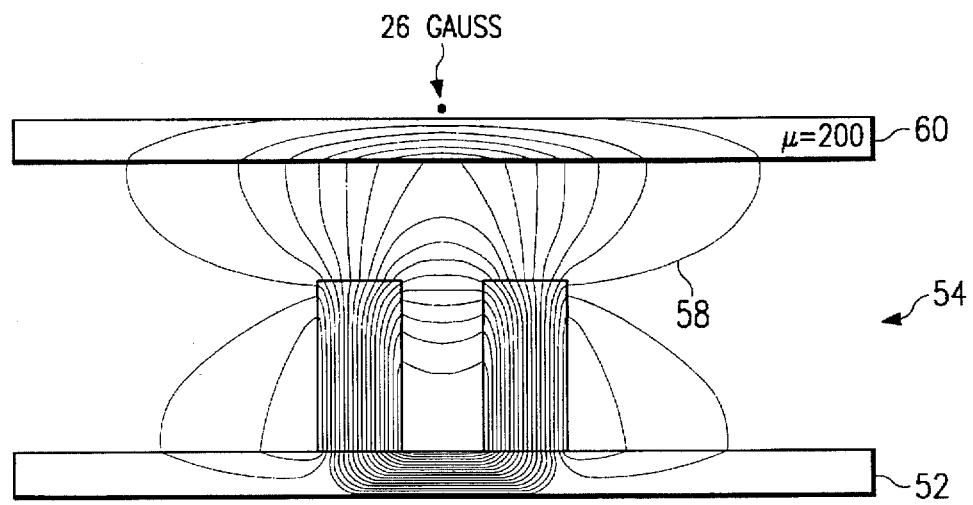

FIGS. 5A and 5B illustrate magnetic field lines from a magnet assembly that does not include an intermediate portion oriented parallel to the target and pole plate. As shown in FIG. 5A, a non-magnetic target 50 is oriented parallel to a pole plate 52 holding a magnet assembly, indicated generally at 54. Magnet assembly 54 does not include a parallel oriented magnetic portion according to the teachings of the present invention. Magnetic field lines 56 illustrate the magnetic field produced by magnet assembly 54. As shown, a point just beyond the surface of target 50 experiences a magnetic field strength of greater than 500 gauss.

FIG. 5B illustrates magnetic field lines 58 generated by magnet assembly 54 with respect to a magnetic target 60. As shown, magnetic target 60 acts to shunt magnetic field lines 58 such that the field produced by magnet assembly 54 is substantially attenuated past magnetic target 60. As shown, a point near the surface of a magnetic target 60 experiences a magnetic field of only approximately 26 gauss. The magnet assembly 54 of FIGS. 5A and 5B is similar to the magnet pairs disclosed and described in U.S. Pat. No. 5,248,402.

Figure 6:
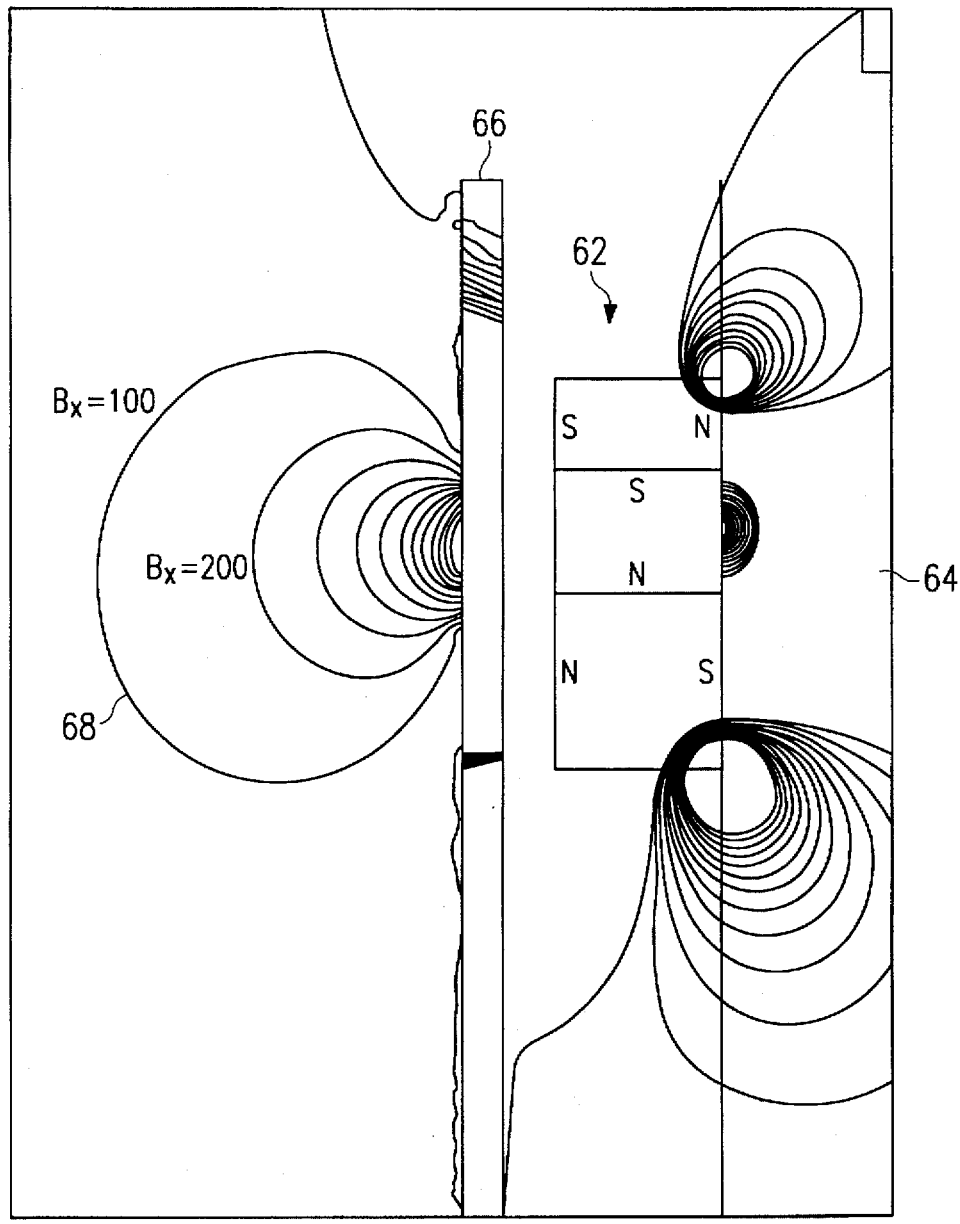
FIG. 6 illustrates magnetic field lines with respect to a magnetic target for a magnet assembly constructed according to the teachings of the present invention.

FIG. 6 illustrates magnetic field lines for a magnetic field generated by a magnet assembly 22 constructed according to the teachings of the present invention. FIG. 6 shows simulated field lines 68 produced by magnet assembly 62 coupled to pole plate 64. Magnet assembly 62 is constructed according to the teachings of the present invention with two perpendicularly oriented magnet portions and one parallel oriented magnet portion, as shown. A magnetic target 66 is oriented parallel to pole plate 64 and experiences magnetic fields as shown by the 100 gauss gradient isolines from 0 to 1200 gauss.

Field lines 68 show that the magnetic field strength is 100 gauss and 200 gauss at the locations shown. Comparison of FIG. 6 with FIG. 5B shows that magnet assembly 62 constructed according to the teachings of the present invention provides enhanced magnet field penetration through target 66.

The simulation of FIG. 6 is generated for magnet flux penetration through a 0.25 inch thick ferromagnetic target with a 0.75 inch trapezoidally shaped magnet portion inserted between the two perpendicular oriented magnets. As shown, the magnetic flux is at least greater than 200 gauss at the target surface.

Figure 7:
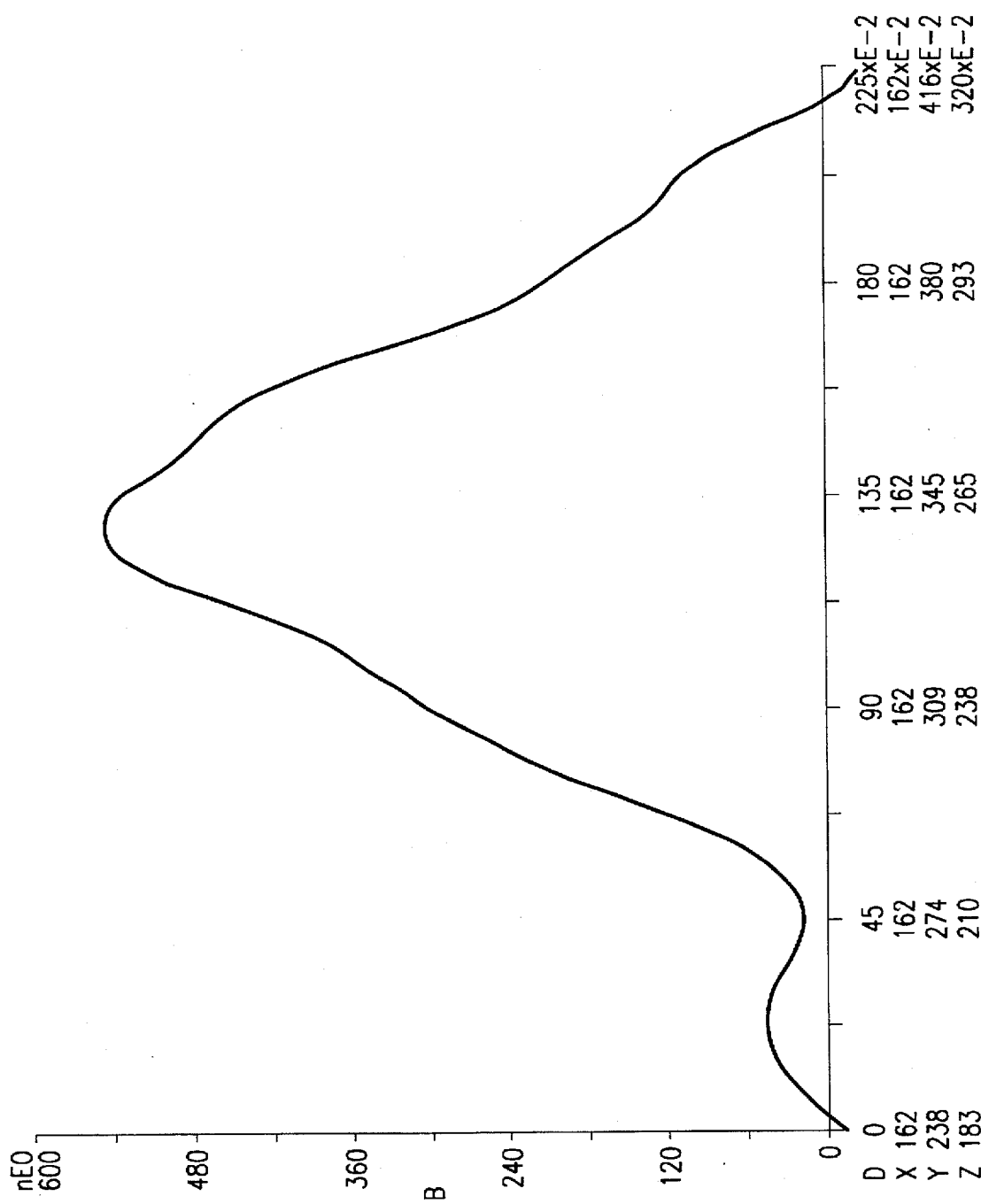
FIG. 7 illustrates a simulation of flux penetration through a magnetic target for a magnet assembly constructed according to the teachings of the present invention.

FIG. 7 illustrates a computer simulation of flux penetration through a 0.25 inch thick ferromagnetic target with a 0.75 inch trapezoidally shaped magnet inserted as described in FIG. 6. The magnetic flux 0.06 inch from the face of the target is 560 gauss, as shown. The data illustrated in FIG. 7 is based on magnetic flux measurements taken from magnets installed on a magnet array backing plate or flux return plate. As shown, the magnetic field is graphed on the Y axis and the distance is graphed on the X axis.

Although the present invention has been described in detail, it should be understood that various changes, substitutions and alterations can be made hereto without departing from the spirit and scope of the invention as defined by the appended claims.

What is claimed is:

1. A high magnetic flux rotatable permanent magnet array for use in a magnetron sputtering system to sputter a substance from a target, the magnet array comprising:

a plurality of magnet assemblies, each magnet assembly comprising:

a first magnetized portion having a magnetization substantially perpendicular to the target, a second magnetized portion having a magnetization substantially perpendicular to the target, the magnetization of the second portion being opposite to the first portion; and a third magnetized portion located between the first portion and the second portion, the third portion having a magnetization substantially parallel to the target.

2. The array of claim 1 further comprising:

a pole plate, the plurality of magnet assemblies coupled to the pole plate to form a generally apple-shaped configuration, and wherein:

the first portion comprises a first magnet oriented such that the magnetic poles are substantially perpendicular to the pole plate with the south magnetic pole proximate the pole plate, the first magnet further located along the outer edge of the generally apple-shaped configuration;

the second portion comprises a second magnet oriented such that the magnetic poles are substantially perpendicular to the pole plate and the north magnetic pole is proximate the pole plate; and the third portion comprising a third magnet located between the first magnet and the second magnet, the third magnet oriented such that the magnetic poles of the third magnet are substantially parallel to the pole plate with the north magnetic pole proximate the first magnet and the south magnetic pole proximate the second magnet.

3. The array of claim 2 further comprising:

an inner magnet retainer; and an outer magnet retainer, the outer magnet retainer cooperating with the inner magnet retainer and the pole plate to hold each of the plurality of magnet assemblies.

4. The array of claim 2 wherein the shape of the third magnet is trapezoidal with the smaller length of the trapezoid proximate the first magnet and the longer length of the trapezoid proximate the second magnet.

5. The array of claim 2 wherein the third magnet is oriented such that the south magnetic pole of the third magnet is proximate the second magnet.

6. The array of claim 1 further comprising:

a pole plate, the plurality of magnet assemblies coupled to the pole plate to form a generally apple-shaped configuration, and wherein:

the first portion comprises a first magnet oriented such that the magnetic poles are substantially perpendicular to the pole plate with the north magnetic pole proximate the pole plate, the first magnet further located along the outer edge of the generally apple-shaped configuration;

the second portion comprises a second magnet oriented such that the magnetic poles are substantially perpendicular to the pole plate and the south magnetic pole is proximate the pole plate; and the third portion comprising a third magnet located between the first magnet and the second magnet, the third magnet oriented such that the magnetic poles of the third magnet are substantially parallel to the pole plate with the south magnetic pole proximate the first magnet and the north magnetic pole proximate the second magnet.

7. The array of claim 1 wherein the first portion, the second portion, and the third portion each comprise a separate structure, and wherein the first, second and third portions are contained within a housing.

8. The array of claim 1 wherein the plurality of magnet assemblies form a generally heart-shaped configuration.

9. The array of claim 1 wherein the plurality of magnet assemblies are arranged to form a generally apple-shaped configuration, and further wherein:

the first portion comprises a first magnet oriented with magnetic poles substantially perpendicular to the target, the first magnet further located along the outer edge of the generally apple-shaped configuration;

the second portion comprises a second magnet oriented with magnetic poles parallel to, and polarity opposite of, the first magnet; and the third portion comprises a third magnet located between the first magnet and the second magnet, the third magnet oriented with a direction of magnetization substantially orthogonal to the directions of magnetization of the first magnet and the second magnet.

10. The array of claim 1 wherein the magnet array is capable of providing magnetic flux penetration through a 0.25 inch thick ferromagnetic target producing greater than 200 gauss magnetic flux density at the target surface within the sputtering process chamber.

11. The array of claim 1 further comprising a target proximate to the magnet array, the target comprising a single piece target made from a magnetic material.

12. The array of claim 1 further comprising a target proximate to the magnet array, the target comprising a disk-shaped single piece target with a thickness between ⅛" and 1".

13. A method of forming a high magnetic flux rotatable permanent magnet array for use in a magnetron sputtering system to sputter a substance from a target, comprising the steps of:

positioning a plurality of magnet assemblies above the target on a plane approximately parallel to the target;

forming each of the plurality of magnet assemblies by:

positioning a first magnetized portion such that the direction of magnetization is substantially perpendicular to the target;

positioning a second magnetized portion such that the direction of magnetization is substantially perpendicular to the target with magnetization being opposite the first magnetized portion, further positioning the second magnetized portion on the same plane as the first magnetized portion; and positioning a third magnetized portion between the first magnetized portion and the second magnetized portion such that the direction of magnetization of the third magnetized portion is substantially parallel to the target.

14. The method of claim 13 further comprising the steps of:

coupling the plurality of magnet assemblies to a pole plate;

arranging the plurality of magnet assemblies to form a generally apple-shaped configuration;

locating the first magnetized portion along the outer edge of the generally apple-shaped configuration;

orienting the first magnetized portion such that the magnetic poles are perpendicular to the pole plate with the south magnetic pole proximate the pole plate;

orienting the second magnetized portion such that the magnetic poles are perpendicular to the pole plate and the north magnetic pole is proximate the pole plate; and orienting the third magnetized portion such that the magnetic poles of the third magnetized portion are parallel to the pole plate with the north magnetic pole proximate the first magnetized portion and the south magnetic pole proximate the second magnetized portion.

15. The method of claim 13 further comprising the steps of:

coupling the plurality of magnet assemblies to a pole plate;

arranging the plurality of magnet assemblies to form a generally apple-shaped configuration;

locating the first magnetized portion along the outer edge of the generally apple-shaped configuration;

orienting the first magnetized portion such that the magnetic poles are perpendicular to the pole plate with the north magnetic pole proximate the pole plate;

orienting the second magnetized portion such that the magnetic poles are perpendicular to the pole plate and the south magnetic pole is proximate the pole plate; and orienting the third magnetized portion such that the magnetic poles of the third magnetized portion are parallel to the pole plate with the south magnetic pole proximate the first magnetized portion and the north magnetic pole proximate the second magnetized portion.

16. The method of claim 13 further comprising the steps of: forming the first magnetized portion from a first magnet, forming the second magnetized portion from a second magnet, and forming the third magnetized portion from a third magnet.

17. The method of claim 16 wherein forming the third magnetized portion further comprises forming the third magnet in the shape of a trapezoid and positioning the third magnet between the first and second magnets such that the smaller length of the trapezoid is proximate the first magnet and longer length of the trapezoid is proximate the second magnet.

18. The method of claim 13 further comprising the steps of:

orienting the first magnetized portion with magnetic poles perpendicular to the target, the first magnetized portion further being located along the outer edge of the generally apple-shaped configuration;

orienting the second magnetized portion with magnetic poles parallel to the first magnetized portion, and having polarity opposite that of the first magnetized portion; and orienting the third magnetized portion inserted between the first magnetized portion and the second magnetized portion with a direction of magnetization substantially orthogonal to the directions of magnetization of the first magnetized portion and the second magnetized portion.

19. A sputtering system having a magnetron, the magnetron having an array of permanent magnets rotatable in proximity to a target disposed in a vacuum chamber, the system comprising:

the array comprising a plurality of magnet assemblies, each magnet assembly comprising;
a first magnet having a magnetization substantially perpendicular to the target,
a second magnet having a magnetization substantially perpendicular to the target, the magnetization of the second magnet being opposite to the magnetization of the first magnet; and
a third magnet located between the first portion and the second portion, the third magnet having a magnetization substantially parallel to the target.

20. The system of claim 19 wherein said array is arranged in a generally apple-shaped configuration.

21. A sputtering system having a magnetron, the magnetron having an array of permanent magnets rotatable in proximity to a planar target disposed in a vacuum chamber, the system comprising:

the array comprising a plurality of magnet assemblies, each magnet assembly comprising;
a first magnet oriented with magnetic poles perpendicular to the target;
a second magnet oriented with magnetic poles parallel to and polarity opposite that of the first magnet; and
a third magnet located between the first magnet and the second magnet, the third magnet oriented with a direction of magnetization substantially orthogonal to the directions of magnetization of the first magnet and the second magnet.

22. The system of claim 21 wherein said array is arranged in a generally apple-shaped configuration.

23. A high-magnetic flux rotatable permanent magnet array for use in a magnetron sputtering system to sputter a substance from a target, the magnet array comprising:

a plurality of magnet assemblies, each magnet assembly comprising at least two neighboring portions with magnetizations substantially perpendicular and parallel to said target for enhanced magnetic field penetration through said target.

* * * * *